US012796355B2

(12) United States Patent
Lee

(10) Patent No.: US 12,796,355 B2
(45) Date of Patent: Nov. 10, 2026

(54) SUBSTRATE PROCESSING METHOD

(71) Applicant: ASM IP Holding B.V., Almere (NL)

(72) Inventor: SeungHyun Lee, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 605 days.

(21) Appl. No.: 18/205,089

(22) Filed: Jun. 2, 2023

(65) Prior Publication Data

US 2023/0395370 A1 Dec. 7, 2023

Related U.S. Application Data

(60) Provisional application No. 63/349,672, filed on Jun. 7, 2022.

(51) Int. Cl.
*H10P 14/60* (2026.01)
*H10P 14/69* (2026.01)

(52) U.S. Cl.
CPC ...... *H10P 14/6506* (2026.01); *H10P 14/6336* (2026.01); *H10P 14/6339* (2026.01); *H10P 14/6905* (2026.01)

(58) Field of Classification Search
CPC ......... H01L 21/02304; H01L 21/02167; H01L 21/02274; H01L 21/0228
See application file for complete search history.

(56) References Cited

U.S. PATENT DOCUMENTS 8,119,527 B1 2/2012 Chadrashekar
8,124,531 B2 2/2012 Chandrashekar
9,034,768 B2 5/2015 Chandrashekar
2004/0115897 A1* 6/2004 Inoue ................. H10D 84/0186 257/E21.546
2015/0235844 A1* 8/2015 Wang .................. H10P 14/6336 438/789
2016/0056032 A1* 2/2016 Baldasseroni .... C23C 16/45527 438/778
2018/0277387 A1* 9/2018 Royer .............. H10D 64/01328
2019/0131140 A1* 5/2019 Sun ........................ C09K 13/00
2019/0348273 A1* 11/2019 Tang ...................... C23C 16/045
2021/0143028 A1* 5/2021 Yokoyama ........ H01J 37/32449

OTHER PUBLICATIONS ip.com search history (Year: 2026).*

* cited by examiner

*Primary Examiner* — Zandra V Smith
*Assistant Examiner* — Andre C Stevenson
(74) *Attorney, Agent, or Firm* — Snell & Wilmer L.L.P.

(57) ABSTRACT

Provided is a substrate processing method for preventing a conductive layer from being oxidized due to activated oxygen gas when filling a gap contacting a conductive layer with oxide film. In an embodiment, a high frequency RF power and a low frequency RF power may be applied to form a dense protective layer in the lower portion of the gap and prevent the activated oxygen gas from reacting with and oxidizing the conductive layer when forming an insulating layer on the protective layer. In another embodiment, a film conversion gas and an inhibiting gas may be supplied to improve a step coverage of the protective layer and a uniform blocking to the activated oxygen gas into the conductive layer along the surface of the gap.

20 Claims, 11 Drawing Sheets

PRIOR ART

PRIOR ART

SUBSTRATE PROCESSING METHOD

CROSS-REFERENCE TO RELATED APPLICATIONS

This application claims priority to U.S. Provisional Patent Application Ser. No. 63/349,672 filed Jun. 7, 2022 titled SUBSTRATE PROCESSING METHOD, the disclosure of which is hereby incorporated by reference in its entirety.

BACKGROUND

1. Technical Field

The disclosure relates to a method for forming a protective layer between an insulating layer filling a gap and a conductive layer contacting the gap, and more specifically to a method for promoting the protective layer to form at the bottom of the gap and for improving a step coverage of the protective layer therein.

2. Description of Related Arts

In semiconductor fabrication process, multiple metal layers (comprising copper, tungsten, or aluminum, for example) may be formed on the semiconductor device structure for an interconnection process, and an insulating layer (comprising silicon oxide, for example) may be formed between the metal layers for providing a separating insulation between the metal layers. The silicon oxide layer may be usually formed by the chemical vapor deposition (CVD) method, but as the line width of the semiconductor device shrinks, the silicon oxide film may be formed by a plasma enhanced atomic layer deposition (PEALD) method. The PEALD method enables formation of a film at low temperature and precise control of the film thickness.

When the silicon oxide layer is formed by PEALD method, a silicon-containing gas and an activated oxygen-containing gas are supplied sequentially to chemically react with each other on a surface of a substrate and form a film thereon. But the activated oxygen-containing gas may oxidize a conductive underlayer or a conductive layer surrounding the silicon oxide layer and deteriorate a device performance such as electrical properties. Therefore, a protective layer is introduced on the conductive layer, e.g. metal layer, prior to forming the silicon oxide layer.

On the other hand, as the degree of integration of a semiconductor device increases, the number of processes carried out on a 3-dimensional structure, a patterned structure, and a gap structure also increases, as an interconnection process and an insulating layer process are also carried out on those device structures. But as the aspect ratio of the gap structure increases, the protective layer is not formed smoothly at the bottom of the gap and may result in the oxidation of the conductive layer. In FIG. 1, a protective layer 3 may be formed between a conductive layer 1 and an insulating layer 2. The conductive layer 1 may be one of: (1) a metal layer such as tungsten, aluminum, or copper; (2) a polysilicon; or (3) a layer doped with conductive materials. The insulating layer 2 may be a silicon oxide layer.

FIG. 2 shows a TEM (Transmission Electron Microscopy) photo image of $SiO_2$ film formed on the gap structure of which the aspect ratio of the bottom to the sidewall is 1:25, and the relative thickness of $SiO_2$ film by the position on the gap. For instance, the ratio of film thickness formed on the top and the lower portion of the gap may be 1:0.25. That is, the film thickness formed at the bottom is about 25% of the film thickness formed on the top, and that shows that a conductive layer, e.g. tungsten layer, surrounding the lower portion of the gap may be highly likely to be exposed to oxygen gas and be oxidized. Therefore, the possibility of conductive layer being oxidized may be higher as the aspect ratio of the gap increases.

FIG. 3 shows a timing graph of the existing processing method for forming a protective layer and a $SiO_2$ insulating layer thereon.

In a first step of FIG. 3, a protective layer may be formed by supplying a silicon-containing source gas and a high frequency RF power (HRF) sequentially and intermittently. During the first step, Ar gas is continuously supplied. The silicon-containing source gas may be aminosilane. The silicon-containing source gas adsorbed on the substrate may be bombarded by Ar radicals activated by RF power and physically decomposed into a film comprising fragments of silicon, nitrogen, carbon, hydrogen, and ligands that are constituents of aminosilane. For instance, a SiCN protective layer may be formed. The first step may be repeated a plurality of times, e.g. M times.

In a second step of FIG. 3, a $SiO_2$ insulating layer may be formed on the protective layer formed on the first step. In more detail, silicon-containing gas, oxygen-containing gas, and RF power are sequentially and intermittently supplied to form the $SiO_2$ insulating layer. The second step may be repeated a plurality of times, e.g. N times.

But when the protective layer is formed on the gap in accordance with FIG. 3, the protective layer may be poorly formed at the lower portion, especially at the bottom of the gap and it may lead to interaction between oxygen radicals and a conductive layer, e.g. metal layer, surrounding the gap and oxidation of the conductive layer during the $SiO_2$ insulating layer is formed. That may deteriorate the electrical properties of the conductive layer and the device.

FIG. 4 is a view of tungsten layer oxidized by oxygen radicals at the lower portion of the gap.

In FIG. 4, a SiCN protective layer is formed on the inner wall of the gap, but not formed at the lower portion. As a result, a tungsten oxide is formed therein by oxygen radicals supplied during a $SiO_2$ insulating layer is formed. The oxidized conductive layer may deteriorate the electrical properties of the semiconductor device as aforementioned.

SUMMARY

In one or more embodiments, a gap fill process may be carried out by plasma enhanced atomic layer deposition. In more detail, the gap fill process may include forming a protective layer and an insulating layer thereon.

In one or more embodiments, a source adsorbed on the substrate during forming the protective layer may be decomposed by a RF power and be converted into a layer comprising a mixture of constituents of source molecules.

In one or more embodiments, a gap fill process may be carried out to improve a film growth rate of the protective layer and prevent an oxidation of conductive layer contacting at least a portion of the gap. In more detail, the gap fill process may include applying a dual frequency RF power during forming the protective layer.

In one or more embodiments, a gap fill process may further include improving a step coverage and a density of the protective layer. In more detail, one or more embodiments may include providing a nitrogen as a film conversion gas and a hydrogen as an inhibiting gas, and the protective layer may be converted into a nitrogen-rich layer and the film growth at the top may be inhibited.

In one or more embodiments, a gap fill process may include further improving a step coverage of the protective layer. In more detail, a plasma treatment may be carried out by applying a RF power after forming the protective layer to bombard the protective layer formed at the top and control a film growth of the protective layer at the top of the gap, and the intensity of the RF power may be greater than the RF power supplied during forming the protective layer.

In one or more embodiments, a gap fill process may further include forming an insulating layer on the protective layer. In more detail, a source gas, an oxygen-containing gas and RF power may be supplied sequentially and intermittently.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE DISCLOSURE

Figure 1:
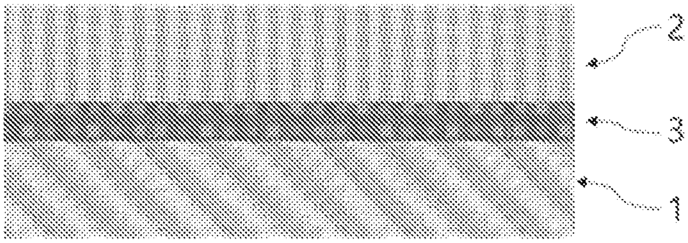
FIG. 1 is a view of protective layer formed between a conductive layer and an insulating layer.
Figure 2:
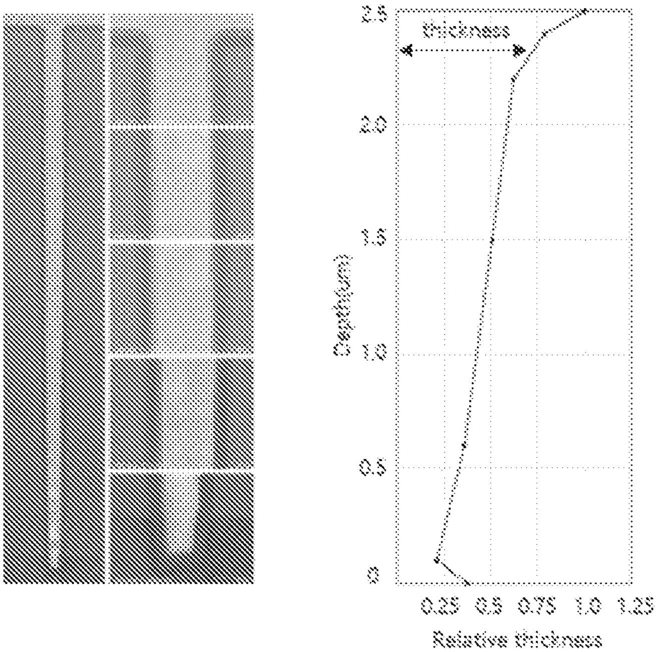
PRIOR ART FIG.2
FIG. 2 is a view of a step coverage of a protective layer on the side wall in the gap with high aspect ratio.
Figure 3:
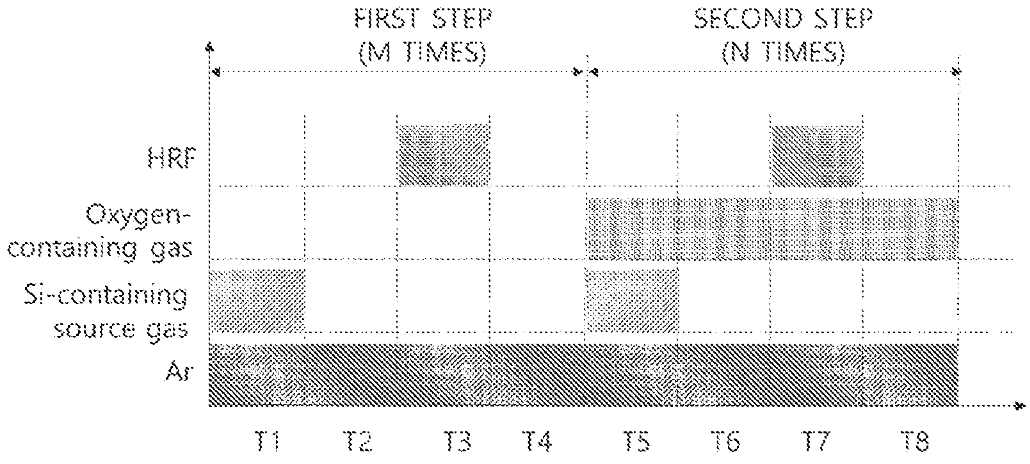
FIG. 3 is a timing graph for forming a protective layer, followed by oxide layer formation of the existing substrate processing method.
Figure 4:
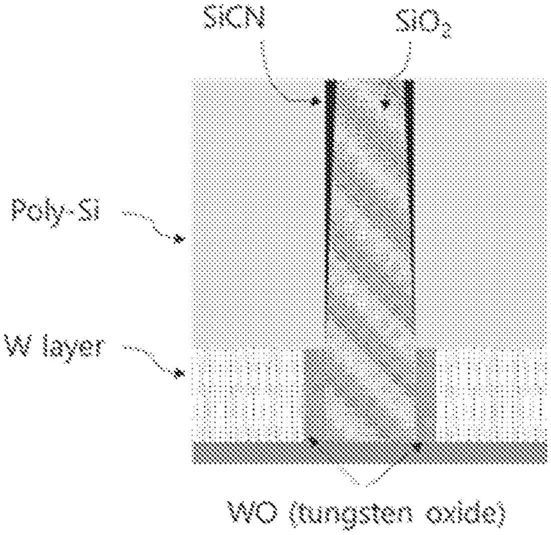
PRIOR ART FIG.4
FIG. 4 is a view of tungsten layer oxidized by oxygen radicals at the lower portion of the gap.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Therefore, the embodiments of the disclosure should not be construed as being limited to the particular shapes of regions illustrated herein but may include deviations in shapes that result, for example, from manufacturing processes.

Hereinafter, embodiments of the disclosure will be described in detail with reference to the accompanying drawings.

The disclosure provides a method for forming a protective layer from a top to a bottom of a gap with high aspect ratio in which at least a portion of the gap may contact a conductive layer, and for increasing a film growth rate of the protective layer in the lower portion of the gap.

Figure 5:
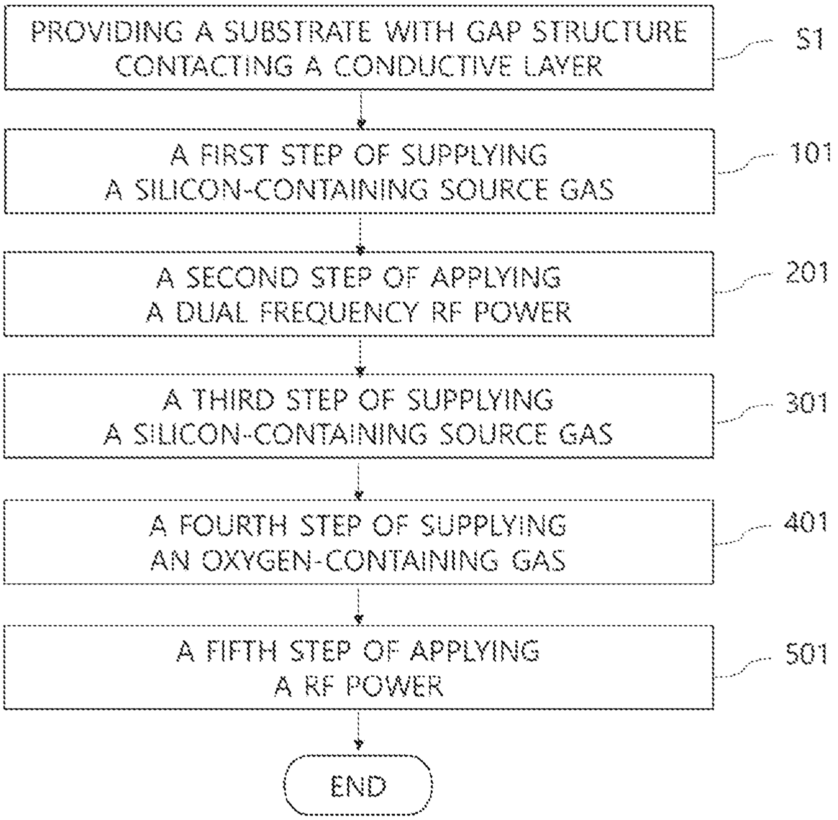
FIG. 5 is a flowchart for a substrate processing method according to an embodiment.

FIG. 5 is a flowchart illustrating a substrate processing method in accordance with an embodiment of the disclosure. Each step of the substrate processing method of FIG. 5 is described in more detail as follows.

First, a substrate with a gap structure may be provided (S1). A portion of the gap structure may contact a conductive layer or penetrate the conductive layer. The conductive layer may comprise one of: (1) a metal layer such as tungsten, aluminum, or copper; (2) a polysilicon; or (3) a layer doped with conductive materials.

In the first step 101, a silicon-containing source gas may be supplied to the substrate. The silicon-containing gas may be aminosilane and be adsorbed onto the top side, the sidewall and the bottom side of the gap along the surface of the gap and form a silicon source layer.

In the second step 201, a dual frequency RF power may be applied. In more detail, a low frequency RF power (LRF) and a high frequency RF power (HRF) may be applied simultaneously. An inert gas may be continuously supplied during the first step 101 and the second step 201. In one exemplary embodiment, the inert gas may be at least one of: argon (Ar) or helium (He). The inert gas may be activated in the second step 201. In an embodiment, the frequency of low frequency RF power may be 200 kHz to 600 kHz, more preferably 300 kHz to 500 kHz, and the frequency of high frequency RF power may be 10 MHz to 80 MHz, more preferably 13 MHz to 60 MHz. The intensity of low frequency RF power may be 30 W to 300 W, more preferably 50 W to 200 W, and the intensity of high frequency RF power may be 100 W to 1,500 W, more preferably 300 W to 1,000 W.

The activated inert gas may ion-bombard the silicon source layer adsorbed on the substrate, resulting in the silicon source layer becoming decomposed and/or densified. The densified silicon source layer may comprise constituents of silicon source molecules. For instance, if the source gas is an aminosilane, the silicon source layer that is ion-bombarded by activated inert gas may be a mixture of fragments of source molecules (e.g. silicon, nitrogen, carbon, or hydrogen) and ligands. The densified silicon source layer may act as a protective layer protecting a conductive underlayer from oxygen radicals in the step of forming an insulating layer described later.

In the second step 201, a high frequency RF power may be applied and more inert gas molecules may be activated. Therefore, a high frequency RF power may provide a technical benefit of enhancing ion-bombardment, decomposition and densification of the silicon source layer.

In the second step 201, a low frequency RF power may also be applied and more inert gas radicals may travel deeper to the lower portion of the gap. As a result, a low frequency RF power may provide a technical benefit of enhancing ion-bombardment, decomposition and densification of a silicon source layer formed in the lower portion of the gap. The first step 101 and the second step 201 may be defined as a step of forming a protective layer and may be repeated a plurality of times. In exemplary embodiment, the protective layer may be SiCN.

In the third step 301, a silicon-containing source gas may be supplied on the protective layer formed through the first step 101 and the second step 201. In exemplary embodiment, the silicon-containing source gas supplied in the third step 301 may be the same as the silicon-containing source gas supplied in the first step 101.

In the fourth step 401, an oxygen-containing gas may be supplied. In the fourth step 401, the oxygen-containing gas may substantially not react with the silicon source layer formed on the protective layer in the third step 301. Therefore, the oxygen-containing gas supplied in the fourth step 401 may act as a purge gas. The oxygen-containing gas may be supplied continuously through the third step, the fourth step, and the fifth step 501 described later. The inert gas may also be supplied continuously with the oxygen-containing gas through the third step 301, the fourth step 401, and the fifth step 501.

In the fifth step 501, a RF power may be applied and the oxygen-containing gas may be activated. The activated oxygen-containing gas may chemically react with the silicon source layer adsorbed on the protective layer and form a silicon oxide layer. In the fifth step 501, only a high frequency RF power may be applied or both a high frequency RF power and a low frequency RF power may be applied simultaneously. In another embodiment, the fourth step 401 and the fifth step 501 may be carried out simultaneously. The third step 301, the fourth step 401 and the fifth step 501 may be repeated a plurality of times to fill the gap. The third step 301 through the fifth step 501 may be defined as a step of forming an insulating layer.

The protective layer may be formed from the top to the side wall to the bottom of the gap during the first step 101 and the second step 102 are carried out. As a result, the oxidation of the conductive underlayer due to the activated oxygen species during formation of the insulating layer may be prevented.

Figure 6:
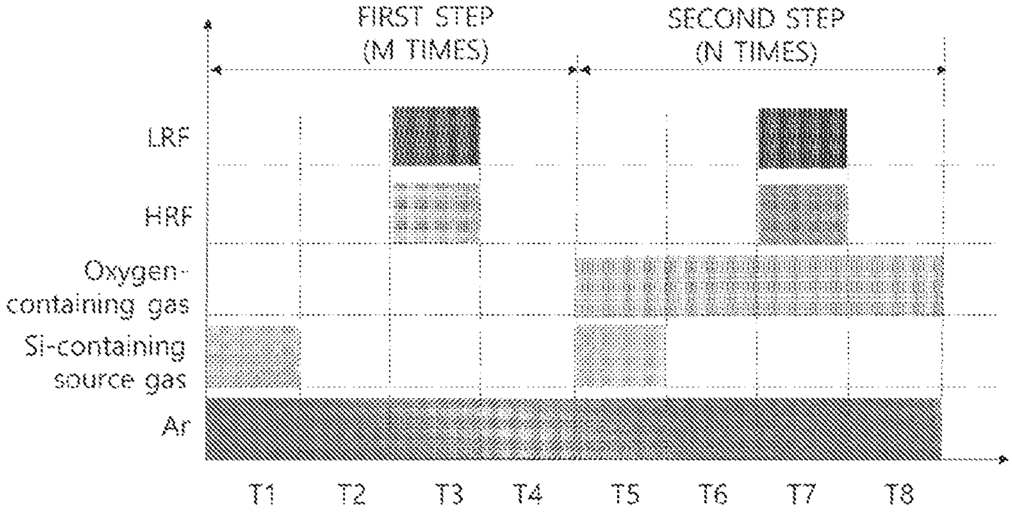
FIG. 6 is a timing graph for forming a protective layer, followed by insulating layer formation of an embodiment.

FIG. 6 is a timing graph illustrating a substrate processing method in accordance with the process flow of FIG. 5.

In FIG. 6, the first step may be a step of forming a protective layer and may correspond to the first step 101 and the second step 201. The second step of FIG. 6 may be a step of forming an insulating layer and may correspond to the thirst step 301 and the fourth step 401. The first step and the second step of FIG. 6 may be repeated a plurality of times.

Figure 7:
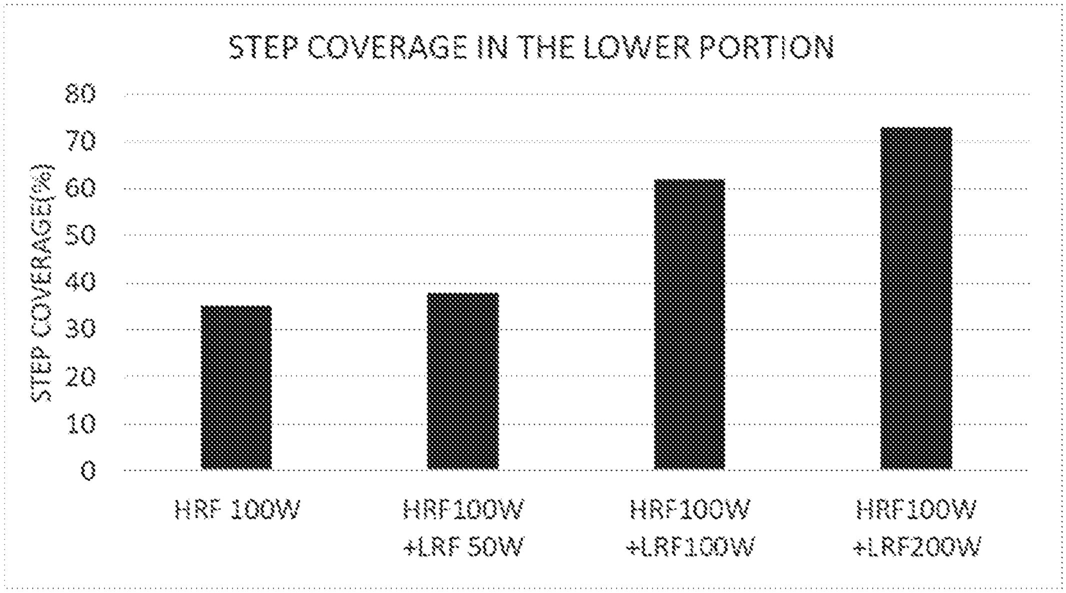
FIG. 7 is a step coverage of protective layer formed at the bottom of the gap in accordance with the intensity of low frequency RF power (LRF power).

FIG. 7 illustrates a step coverage of the protective layer formed in the lower portion of the gap in accordance with the intensity of low frequency RF power. In FIG. 7, a step coverage of the protective layer improves as the intensity of low frequency RF power increases. As an active inert gas may travel deep into the lower portion, a silicon source layer formed therein which may have physically and weakly-bonded structure may be more densified and may have a clearer film profile. Therefore, a step coverage of the protective layer may be improved.

Figure 8:
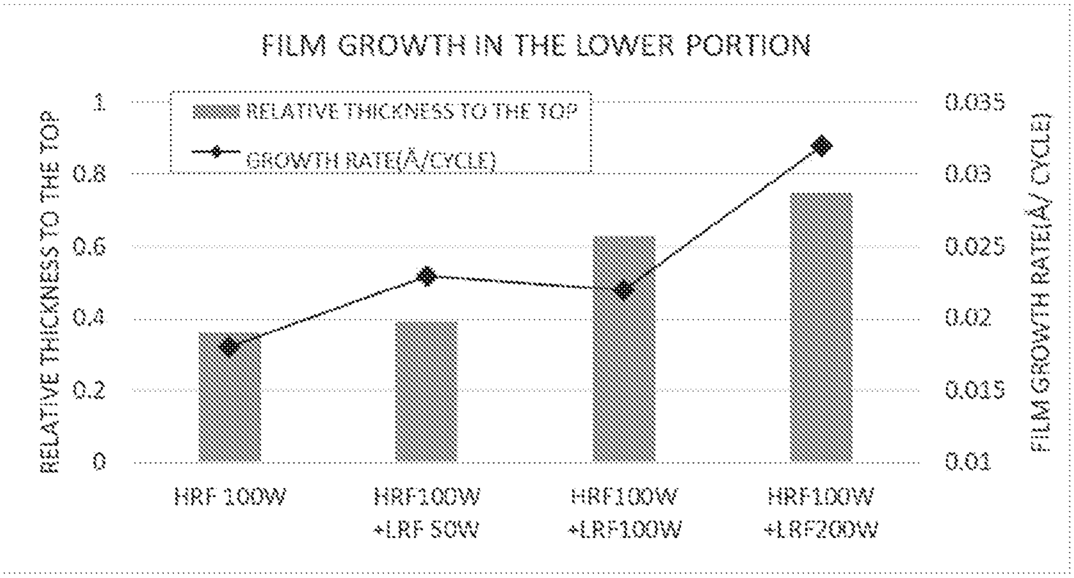
FIG. 8 is a relative film thickness to the top and a growth rate of protective layer formed at the bottom of the gap in accordance with the intensity of LRF power.

FIG. 8 illustrates a film growth rate of the protective layer in the lower portion of the gap and a relative thickness of the protective layer formed therein compared to the film thickness at the top in accordance with the intensity of low frequency RF power applied.

In FIG. 8, a film growth rate of the protective layer formed in the lower portion may increase as the intensity of the low frequency RF power increases and the relative thickness of the protective layer formed in the bottom may increase from 37% to 73% compared to the film thickness of the protective layer formed at the top as the as the intensity of the low frequency RF power increases.

As shown in FIG. 7 and FIG. 8, a low frequency RF power may enable active species to travel deep to the lower portion of the gap and facilitate more the formation of the protective layer in the lower portion of the gap. Therefore, the low frequency RF power may provide a technical benefit of preventing the conductive layer contacting the lower portion of the gap from being oxidized by activated oxygen species.

Figure 9:
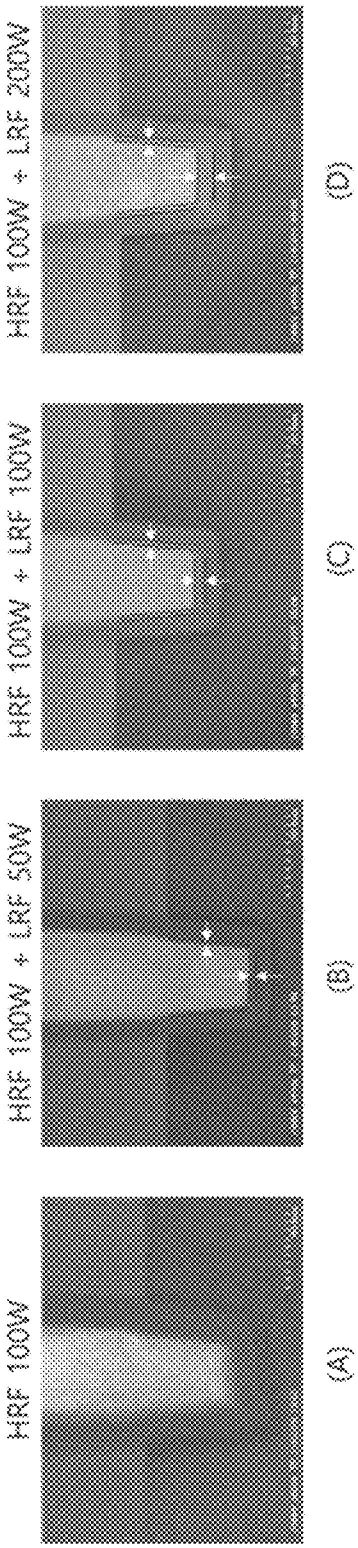
FIG. 9 (A)-(D) illustrates views of TEM images of protective layer formed at the bottom in accordance with the intensity of LRF power.

FIG. 9 (A)-(D) illustrates views of TEM (Transmission Electron Microscope) images showing a protective layer contacting a conductive layer at the bottom (including the side-bottom) of the gap in accordance with the intensity of low frequency RF power applied in which the intensity of high frequency RF power may be kept constant.

In FIG. 9(A), the protective layer may not be formed at the bottom when the low frequency RF power is not applied. However, in FIG. 9(B)-(D), the protective layer may be formed and the thickness may increase as the intensity of low frequency RF power increases. Therefore, the formation of protective layer in the lower portion be facilitated more by applying a low frequency RF power.

The disclosure further discloses a substrate processing method for preventing a conductive layer from being oxidized more effectively. When the protective layer may be formed more uniformly along the surface of the gap and the step coverage of the protective layer may improve, the penetration of oxygen radicals into the conductive layer and the oxidation of the conductive layer may be prevented more effectively in the subsequent step of forming an insulating layer. That is, the penetration of the active oxygen species into the conductive layer may be more uniformly prevented along the surface of the gap by improving the step coverage of the protective layer.

For instance, when the activated oxygen is supplied in the step of forming an insulating layer, the oxidation of conductive layer may occur in the position of the gap in which the step coverage of the protective layer may be poor, that is, the thickness of the protective layer may be thinner than the thickness of the protective layer in other positions of the gap in which the step coverage protective layer may be better.

Therefore, another embodiment of the disclosure discloses a method for improving a step coverage of the protective layer formed on the gap.

Figure 10:
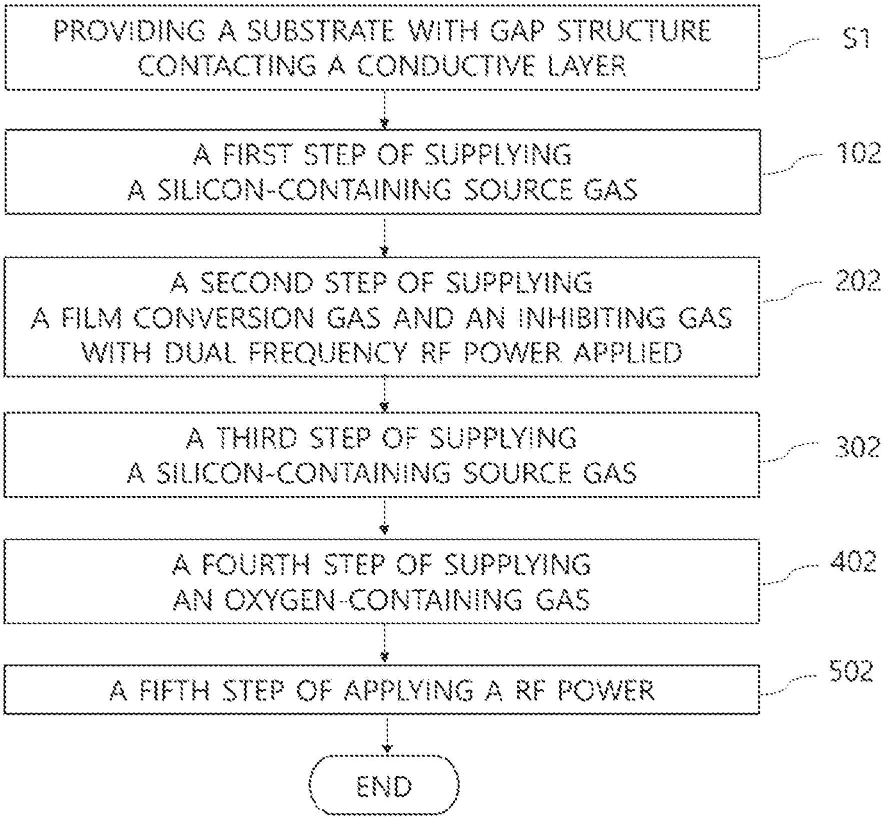
FIG. 10 is a flowchart for substrate processing method according to another embodiment.

FIG. 10 is a flowchart showing a substrate processing method according to another embodiment of the disclosure.

In FIG. 10, a film conversion gas and an inhibiting gas may be supplied in the second step 202 with dual frequency RF power applied to the substrate. For instance, in exemplary embodiment of forming a SiCN protective layer on the gap, an activated nitrogen (N2) (as a film conversion gas) may be supplied and an activated hydrogen (as an inhibiting gas) may be supplied.

The activated nitrogen may chemically react and bond with the SiCN protective layer. Therefore, at least a portion of the SiCN protective layer, which is a physically bonded mixture of fragments of source gas constituents, may be converted into a nitrogen-rich SiCN protective layer.

The nitrogen-rich SiCN protective layer may comprise a chemically bonded mixture. Therefore, the hardness, the density and the step coverage of the SiCN layer may be uniformly improved along the surface of the gap through the top to the sidewall to the bottom of the gap. As a result, the oxidation of the conductive layer may be prevented more uniformly and effectively along the surface of the gap through the top to the sidewall to the bottom of the gap.

The activated hydrogen may act as a deposition inhibitor at the top of the gap and inhibit the growth of SiCN protective layer. For instance, the activated hydrogen may react with the SiCN protective layer and a portion of SiCN layer may be removed as byproducts in the form of gaseous ammonia (NH 3), therefore inhibiting the formation and the growth of SiCN protective layer at the top portion. The third step 302, the fourth step 402, and the fifth step 502 of FIG. 10 may be the same as the third step 301, the fourth step 401, and the fifth step 501 of FIG. 5 respectively.

Figure 11:
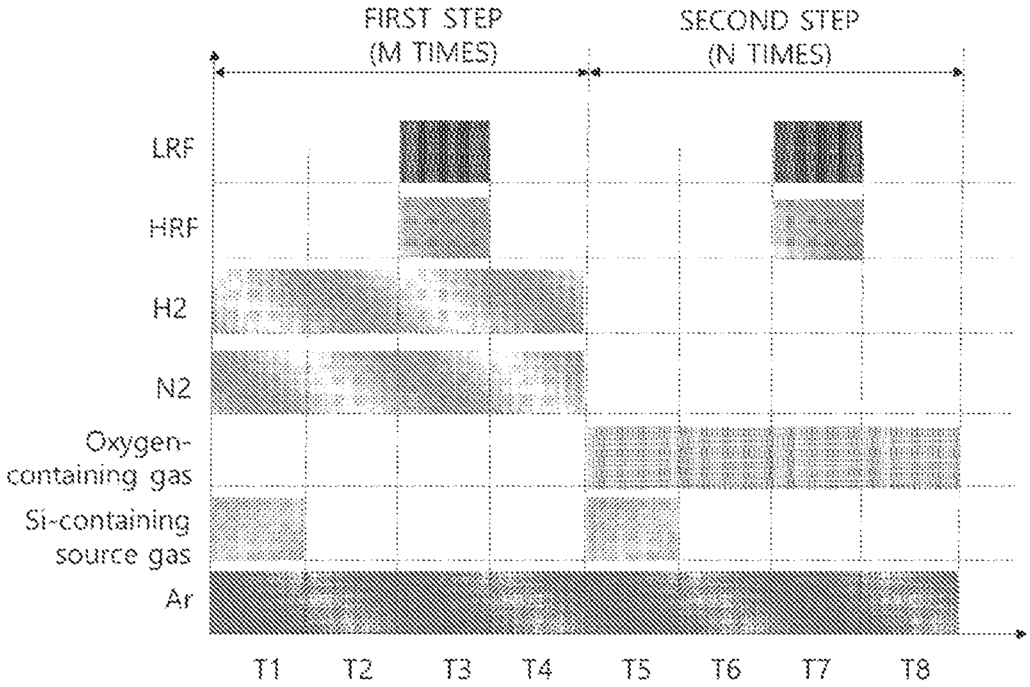
FIG. 11 is a timing graph for forming a protective layer, followed by insulating layer formation of another embodiment.

FIG. 11 illustrates a timing graph in accordance with the substrate processing method of FIG. 10. In FIG. 11, a first step of forming a protective layer may be repeated a plurality of times (M times), supplying a silicon-containing gas and a dual frequency RF power sequentially and intermittently, and a step of second step of forming an insulating layer may be repeated a plurality of times (N times), supplying a silicon-containing gas and an oxygen-containing gas sequentially and intermittently. The inert gas, e.g. Ar, may be continuously supplied throughout the process and bombard the source layer adsorbed on the substrate during forming a SiCN protective layer. As the activated nitrogen is supplied, the SiCN protective layer may be nitrogen-rich.

On the other hand, a first step of forming a protective layer according to the embodiment of FIG. 10 and FIG. 11 may be repeated a plurality of times, e.g. M times. But the thickness of the protective layer formed in the upper portion of the gap may be thicker than the thickness of the protective layer formed in the lower portion of the gap as the number of repeat increases, and it may lead to ununiform blocking to the penetration of active oxygen species into the conductive layer along the surface of the gap. Therefore, the disclosure further discloses a substrate processing method of improving the step coverage of the protective layer formed along the surface of the gap.

Figure 12:
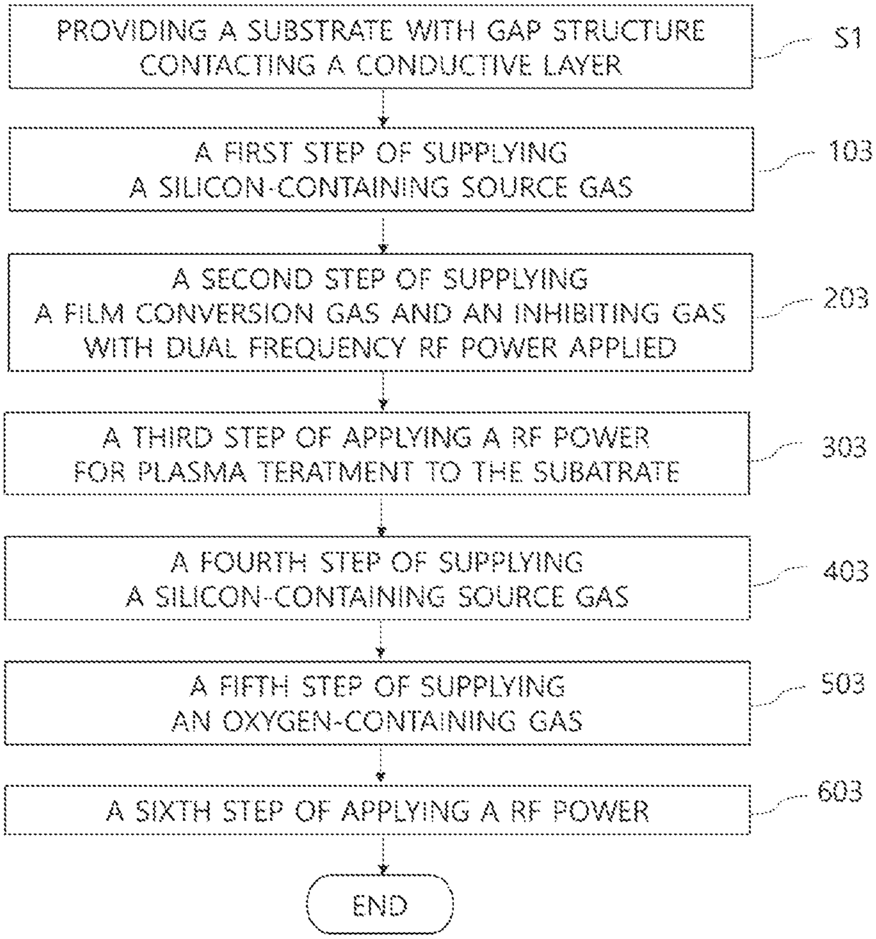
FIG. 12 is a flowchart for substrate processing method according to another embodiment.

FIG. 12 is a flowchart for substrate processing method according to another embodiment of the disclosure.

In FIG. 12, a step of applying a RF power for plasma treatment 303 may be further provided after the step of forming a protective layer 103 and 203. The plasma treatment may ion-bombard and physically remove the protective layer formed in the upper portion of the gap. Therefore, it may have the technical benefit that the film formation in the upper portion may be suppressed and controlled.

In another exemplary embodiment of FIG. 12, an activated heavy inert gas such as Ar may be supplied to increase the ion-bombardment effect and a high frequency RF power (HRF) may be applied to concentrate active inert gas to the upper portion of the gap as the travel distance of active species may be relatively short under high frequency RF power.

In another exemplary embodiment of FIG. 12, in the step of plasma treatment 303, the intensity of RF power applied may be greater than the intensity of RF power applied in the step of forming a protective layer 203. For instance, in the step of plasma treatment 303, the intensity of RF power applied may be 500 W to 1,500 W, or more preferably 700 W to 1,000 W. In the step of forming a protective layer 203, the intensity of RF power applied may be 100 W to 1,000 W, or more preferably 300 W to 800 W.

In another exemplary embodiment of FIG. 12, in the step of plasma treatment 303 a RF power may be applied longer than a RF power applied in the step of forming a protective layer 203. For instance, in the step of plasma treatment 303, a RF power may be applied for second to 4 seconds, or more preferably for 0.2 seconds to 2 seconds. In the step of forming a protective layer 203, a RF power may be applied for 0.1 second to 1 second, or more preferably 0.2 seconds to 0.8 seconds. Therefore, it may prevent the desorbed species from recombining into the protective layer formed in the upper portion of the gap and therefore may improve a step coverage of the protective layer along the surface of the gap.

Figure 13:
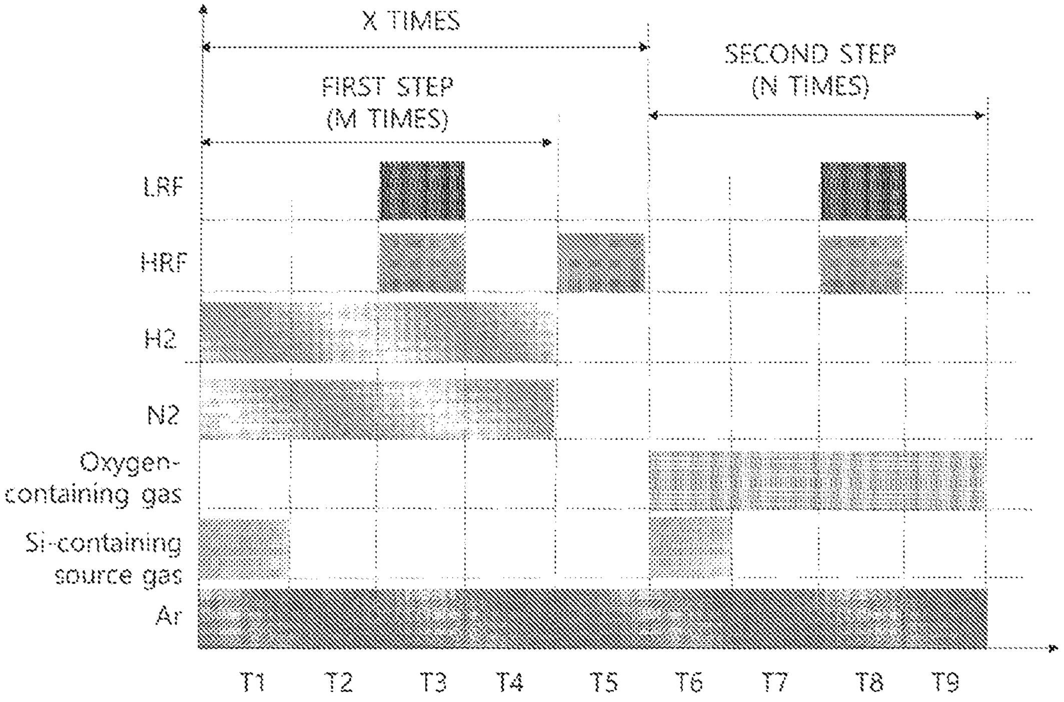
FIG. 13 is a timing graph for forming a protective layer, followed by insulating layer formation of another embodiment.

FIG. 13 illustrates a timing graph according to the substrate processing method of FIG. 12.

In FIG. 13, a RF power may be applied longer in the step of plasma treatment T5 than a RF power applied in the step of forming a protective layer T3. In another exemplary embodiment, the intensity of RF power applied in the step of plasma treatment T5 may be greater than a RF power applied in the step of forming a protective layer T3.

The protective layer formation and the subsequent plasma treatment in FIG. 13 may be carried out by performing a super cycle in which the step of forming a protective layer, i.e. T1 to T3, may be repeated a plurality of times, e.g. M times, and the step of plasma treatment may be carried out. After that, the step of forming a protective layer, i.e. T1 to T3, and the step of plasma treatment T5 in group may be repeated a plurality of times, e.g. X times.

After the super cycle is completed, the step of forming an insulating layer, i.e. T6 to T9, may be carried out. The details of the step of forming an insulating layer were already provided in the description of FIG. 5 to FIG. 10, so the detailed description will be omitted.

In FIG. 12 and FIG. 13, a nitrogen gas and a hydrogen gas may be provided to improve a step coverage of protective film, followed by a plasma treatment. But in another exemplary embodiment, a protective layer may be formed without supplying a nitrogen gas and a hydrogen gas shown in FIG. 5 and FIG. 6, followed by a plasma treatment.

Figure 14:
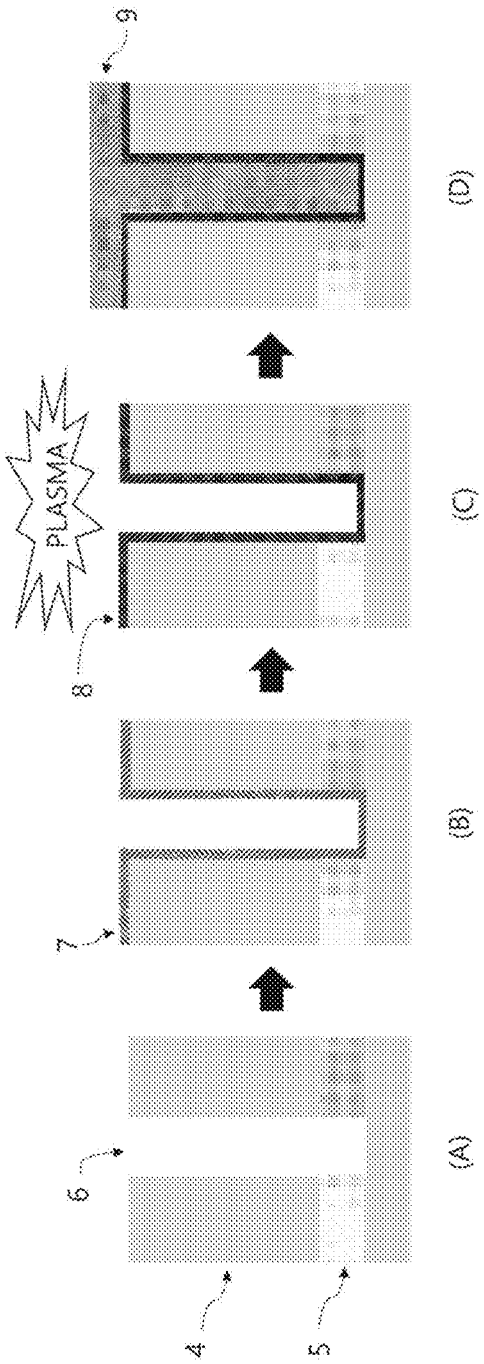
FIG. 14(A)-(D) illustrates views of a process of forming a protective layer and filing a gap in accordance with an embodiment of the disclosure and suppression of oxidation of conductive layer in a device.

FIG. 14 (A)-(D) illustrates views of a process of forming a protective layer and filling a gap in accordance with an embodiment of the disclosure and suppression of oxidation of conductive layer in a device.

In FIG. 14(A), a gap 6 may be formed in a substrate comprising an oxide layer 4 and a conductive layer 5. The gap may have an aspect ratio of greater than 10:1. The conductive layer may be formed in the deep portion of the substrate and the lower portion of the gap 6 may contact the conductive layer 5. But the position of the conductive layer 5 is not limited thereto. In another embodiment, the conductive layer may be formed in any portion of the substrate (e.g. top portion or middle portion of the substrate).

In FIG. 14(B), a silicon-containing gas may be supplied to the substrate and a silicon source layer 7 may be formed on the surface of the gap from the top to the bottom of the gap.

In FIG. 14(C), a dual frequency RF power comprising a low frequency RF power and a high frequency RF power may be applied and an inert gas may be supplied simultaneously. The inert gas may be activated by RF power, and decompose and ion-bombard the silicon source layer 7. As a result, a silicon source layer 7 may be densified from the top to the bottom of the gap and may be converted into a protective layer 8. FIGS. 14(A) and (B) may be repeated a plurality of times.

In another embodiment, a plasma treatment may be further carried out after forming the protective layer to improve a step coverage of the protective film formed on the surface of the gap.

In FIG. 14(D), a silicon-containing gas and an oxygen-containing gas may be sequentially and intermittently supplied to form a $SiO_2$ film and fill the gap. Optionally, the oxygen-containing gas may be activated by RF power. In an embodiment, this step (FIG. 14(D)) may be repeated a plurality of times.

In FIG. 14, an oxidation of conductive layer of the semiconductor device is prevented by applying a substrate processing method of the disclosure. The conductive layer may be one of: (1) tungsten, aluminum, or copper, (2) polysilicon, or (3) a layer doped with conductive materials. The semiconductor device may be a dynamic random access memory (DRAM) device, NAND flash memory device, non-memory logic device or TSV (Through-Silicon-Via) device.

Table 1 shows a process condition for an embodiment of the disclosure.

TABLE 1 a process condition for an embodiment of the disclosure

| Process parameter | | Condition |
|---|---|---|
| Gas flow (sccm) | Source carrier Ar | 1,000 to 5,000 (preferably 1,500 to 4,500) |
| | Purge Ar | 500 to 3,000 (preferably 1,000 to 2,000) |
| | $O_2$ | 500 to 2,000 (preferably 1,000 to 1,500) |
| | $N_2$ | 500 to 2,000 (preferably 1,000 to 1,500) |
| | $H_2$ | 500 to 2,000 (preferably 1,000 to 1,500) |
| RF frequency | HRF | 13 to 60 MHz |
| | LRF | 300 to 500 kHz |
| RF power (W) | HRF | 100 to 1,500 W (preferably 300 to 1,000 W) |
| | LRF | 30 to 300 W (preferably 50 to 200 W) |
| Step time/cycle (sec) | Source feeding | 0.1 to 1.0 (preferably 0.2 to 0.8) |
| | Source purge | 0.1 to 1.0 (preferably 0.2 to 0.8) |
| | RF- On | 0.1 to 1.0 (preferably 0.2 to 0.8) |
| | Purge | 0.1 to 1.0 (preferably 0.2 to 0.8) |
| | Plasma treatment | 0.1 to 4.0 (preferably 0.2 to 2.0) |
| Process temperature (° C.) | | 300 to 500 (preferably 350 to 450) |
| Silicon source | | Aminosilane |

A silicon-containing source gas for forming a protective layer in accordance with an embodiment of the disclosure and Table 1 may be at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(Nme_2)_2$; BTBAS, $SiH_2(NhtBu)_2$; BITS, $SiH_2(NHSiMe_3)_2$; DIPAS, $SiH_3N(iPr)_2$; TEOS, $Si(Oet)_4$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$, or the mixture or derivatives thereof.

A silicon-containing source gas for forming an insulating layer in accordance with an embodiment of the disclosure and Table 1 may be at least one of TSA, $(SiH_3)_3N$; DSO, $(SiH_3)_2$; DSMA, $(SiH_3)_2Nme$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH_2(Nme_2)_2$; BTBAS, $SiH_2(NhtBu)_2$; BITS, $SiH_2(NHSiMe_3)_2$; DIPAS, $SiH_3N(iPr)_2$; TEOS, $Si(Oet)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$, or the mixture or derivatives thereof.

An oxygen-containing gas for forming an insulating layer in accordance with an embodiment of the disclosure and Table 1 may be at least one of $O_2$, $O_3$, $CO_2$, $H_2O$, $NO_2$, $N_2O$ or the mixture or derivatives thereof.

A nitrogen-containing gas for forming a protective layer in accordance with an embodiment of the disclosure and Table 1 may be at least one of $N_2$, $N_2O$, $NO_2$, $NH_3$, $N_2H_2$, $N_2H_4$ or the mixture or derivatives thereof.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A method for filling a gap of a substrate, comprising:

a step of forming a protective layer on a surface of a gap by repeating a cyclic process; and a step of forming an insulating layer on the protective layer to fill the gap by performing a plurality of cycles, each cycle comprising, while continuously supplying an oxygen-containing gas:

supplying a silicon-containing gas to form a silicon source layer on the protective layer while RF power is not applied, wherein the oxygen-containing gas substantially does not react with the silicon source layer; and applying the RF power to activate the oxygen-containing gas such that the oxygen-containing gas chemically reacts with the silicon source layer to form a silicon oxide layer, wherein a portion of the protective layer contacts a conductive layer formed in the substrate.

2. The method of claim 1, wherein the step of forming the protective layer on the surface of the gap comprises a step of forming a silicon-containing layer comprising:

a step of supplying a silicon-containing gas to form an adsorbed source layer; and after the step of supplying the silicon-containing gas, a step of applying a dual frequency RF power to decompose the adsorbed source layer, wherein an inert gas is supplied during the step of applying the dual frequency RF power, and wherein the dual frequency RF power comprises a high frequency RF power and a low frequency RF power.

3. The method of claim 2, wherein the silicon-containing layer is formed from a top portion to a bottom portion of the gap along the surface of the gap, and is decomposed and/or densified by activated inert gas, wherein the silicon-containing layer comprises elements of silicon, carbon and nitrogen, or a mixture thereof.

4. The method of claim 3, wherein the silicon-containing layer comprises SiCN.

5. The method of claim 3, wherein a film growth rate and a step coverage of the silicon-containing layer in the bottom portion of the gap increases as an intensity of the low frequency RF power increases.

6. The method of claim 2, wherein the frequency of the high frequency RF power is between about 10 MHz and about 80 MHz, and the frequency of the low frequency RF power is between about 200 kHz and about 600 kHz.

7. The method of claim 2, wherein the step of forming the protective layer further comprises:

a step of supplying a film conversion gas and an inhibiting gas, wherein the film conversion gas comprises nitrogen and the inhibiting gas comprises hydrogen.

8. The method of claim 7, wherein the film conversion gas and the inhibiting gas are supplied continuously throughout the step of forming the protective layer.

9. The method of claim 7, wherein a film growth of the silicon-containing layer at a top portion of the gap is inhibited.

10. The method of claim 7, wherein the step of forming the protective layer further comprises:

a step of applying an RF power for plasma treatment to the substrate while not supplying the silicon-containing gas, wherein activated inert gas bombards and removes at least a portion of the silicon-containing layer formed on a top portion of the gap.

11. The method of claim 10, wherein the RF power for plasma treatment to the substrate comprises the high frequency RF power.

12. The method of claim 11, wherein an intensity of the RF power for plasma treatment to the substrate is greater than an intensity of the high frequency RF power applied during the step of applying the dual frequency RF power.

13. The method of claim 10, wherein the step of supplying the silicon-containing gas is repeated a plurality of times prior to the step of supplying the RF power for plasma treatment.

14. The method of claim 7, wherein the film conversion gas comprises at least one of $N_2$, $N_2O$, $NO_2$, $NH_3$, $N_2H_2$, $N_2H_4$, or a mixture thereof.

15. The method of claim 2, wherein the silicon-containing gas comprises at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2$ $(NEt_2)_2$; BDMAS, $SiH_2$ $(NMe_2)_2$; BTBAS, $SiH_2$ $(NHtBu)_2$; BITS, $SiH_2$ $(NHSiMe_3)_2$; DIPAS, $SiH_3N(iPr)_2$; TEOS, $Si(OEt)_4$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$, or a mixture thereof.

16. The method of claim 2, wherein the protective layer formed on the surface of the gap prevents an oxidation of the conductive layer.

17. The method of claim 16, wherein the conductive layer comprises at least one of tungsten, aluminum, copper, polysilicon or a layer doped with a conductive material, or a mixture thereof.

18. The method of claim 1, wherein the

RF power comprises a high frequency RF power and a low frequency RF power.

19. The method of claim 18, wherein the silicon-containing gas comprises at least one of one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2$ $(NEt_2)_2$; BDMAS, $SiH_2$ $(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)_4$; $SiCl_4$; HCD, $Si_2Cl_6$; 3DMAS, $SiH(N(Me)_2)_3$; BEMAS, $SiH_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; $SiH_2I_2$; or a mixture or derivatives thereof.

20. The method of claim 19, wherein the oxygen-containing gas comprises at least one of $O_2$, $O_3$, $CO_2$, $H_2O$, $NO_2$, $N_2O$, or a mixture or derivatives thereof.

* * * * *